United States Patent [19]

Tadokoro

[11] Patent Number: 5,677,748
[45] Date of Patent: Oct. 14, 1997

[54] LEAD WIRE ARRANGEMENT FOR LCD HAVING GLASS SEALED WIRES

[75] Inventor: Shinichi Tadokoro, Fujisawa, Japan

[73] Assignee: Molex Incorporated, Lisle, Ill.

[21] Appl. No.: 399,270

[22] Filed: Mar. 6, 1995

[30] Foreign Application Priority Data

Apr. 28, 1994 [JP] Japan ................. 6-114704

[51] Int. Cl.$^6$ ................. G02F 1/1345
[52] U.S. Cl. ................. 349/152; 349/150
[58] Field of Search ................. 349/58, 149, 150, 349/151, 152; 439/67, 495, 874; 174/52.1, 52.3, 59, 60, 260, 261; 361/784, 785, 789

[56] References Cited

U.S. PATENT DOCUMENTS

| | | | |
|---|---|---|---|
| 4,187,606 | 2/1980 | Sinclair | 29/629 |
| 4,335,750 | 6/1982 | Ostman | 29/847 |
| 4,701,999 | 10/1987 | Palmer | 437/211 |
| 4,960,391 | 10/1990 | Beinhaur et al. | 439/559 |
| 5,309,316 | 5/1994 | Yagi et al. | 361/749 |

FOREIGN PATENT DOCUMENTS 03004464 1/1991 Japan ................. H01R 9/07

OTHER PUBLICATIONS

JP 03004464—Publication Number—Abstract Translation Attached Jan. 1991.

*Primary Examiner*—William L. Sikes
*Assistant Examiner*—Tai V. Duong
*Attorney, Agent, or Firm*—Stephen Z. Weiss

[57] ABSTRACT

Disclosed is an improved electrical connector system for connecting metal leads protruding from a glass sealed electrical device to another circuit member. An array of conductors side by side at regular intervals are stamped from a thin sheet of metal with a melting point that is generally equal to that of the metal of the protruding glass-sealed metal leads. The conductor array has pieces of insulation tape applied to its opposite surfaces, holding the array together. The array may have pieces of insulation tape arranged so that the mid point of the conductors will be exposed providing a heat-radiating area. The one end of the conductor is fused to the metal leads by laser beam welding.

5 Claims, 6 Drawing Sheets

LEAD WIRE ARRANGEMENT FOR LCD HAVING GLASS SEALED WIRES

FIELD OF THE INVENTION

The present invention relates to a connector system for connecting glass-sealed metal leads protruding from an electrical device to another circuit member, and more particularly to an arrangement of stamped conductive terminals where one end of each terminal is to be electrically connected to a respective metal lead extending from the glass-sealed device by laser beam welding.

BACKGROUND OF THE INVENTION

As is well known, a variety of wires and cables are available to electrically connect one electric apparatus to another. The conductors of these wire or cables must first be connected to the respective electrical apparatus before the conductors may join them together. One method of connecting a cable to an apparatus is with the use of an intermediate connector gripping the protruding metal leads of an apparatus. Another method is by fusing the conductor of the wire or cable directly to the protruding metal lead.

With a liquid crystal display apparatus having a plurality of glass-sealed lead wires, electric connections can be made in the same way as described above. However during the process of enclosing the liquid crystal display in glass with the metal leads partially protruding, the leads must withstand the very high temperatures needed to melt glass without itself melting. These high temperatures cause oxidation on the surface of the metal lead. A mechanical connector may not make good electrical contact through the oxidation layer. Also a good solder joint cannot be made without burnishing the metal lead and removing the oxidized coatings from their surfaces. It is difficult and time consuming to burnish and complete the wire-soldering process because the metal leads are too numerous and too small.

In an attempt to make such numerous electric connections between the protruding metal leads of an electric device such as a liquid crystal display and conductors of wires or a cable with ease and certainty, laser beam welding has been proposed.

Such laser beam welding, creates a very high temperature in the metal leads and the conductors. With such high temperatures the conductors of the wires or cables to be welded to the protruding metal leads are likely to be melted, prior to the melting of the metal leads. This will reduce the amount of the wire or cable conductor remaining after the welding process has been completed thus creating a defective electric connection.

SUMMARY OF THE INVENTION

In view of the above, one object of the present invention is to provide a system for connecting metal leads protruding from a glass-sealed device to a group of conductors, which permits electrical connections to be made with ease and certainty where the metal leads and the wire or cable conductors are joined by fusing the metal surfaces with heat.

To attain this object an electrical connector system for a liquid crystal display is provided comprising a liquid crystal display completely sealed in a glass enclosure with metal leads protruding out from the enclosure. The metal leads have a melting point greater than the melting point of the glass. A connector for electrically connecting the metal leads to a mating circuit member includes, a dielectric housing and stamped conductors. The conductors are stamped from a thin flat sheet of metal having a melting point generally equal to the melting point of the protrusions and are formed in a side by side array at regular intervals. Each of the conductors have two ends and are maintained in the array by a flexible sheet of dielectric material adhered to at least one surface of the conductors. One end of each conductor is held in the dielectric housing and is adapted to mate with terminals in the mating circuit member. The other end of each conductor is adapted to be fused with heat to a respective one of the metal leads.

The electrical connector system may also include conductors stamped from a sheet of iron and nickel alloy. The flexible sheet of dielectric material holding the conductors in an array may be adhered to opposite surfaces of the conductors and may have the midpoint portion of the conductors partially exposed to allow for heat transfer.

BRIEF DESCRIPTION OF THE DRAWINGS

Other objects and advantages of the present invention will be understood from the following description of preferred embodiments which are shown in the accompanying drawings.

DETAILED DESCRIPTION OF THE PREFERRED EMBODIMENT

Figure 1:
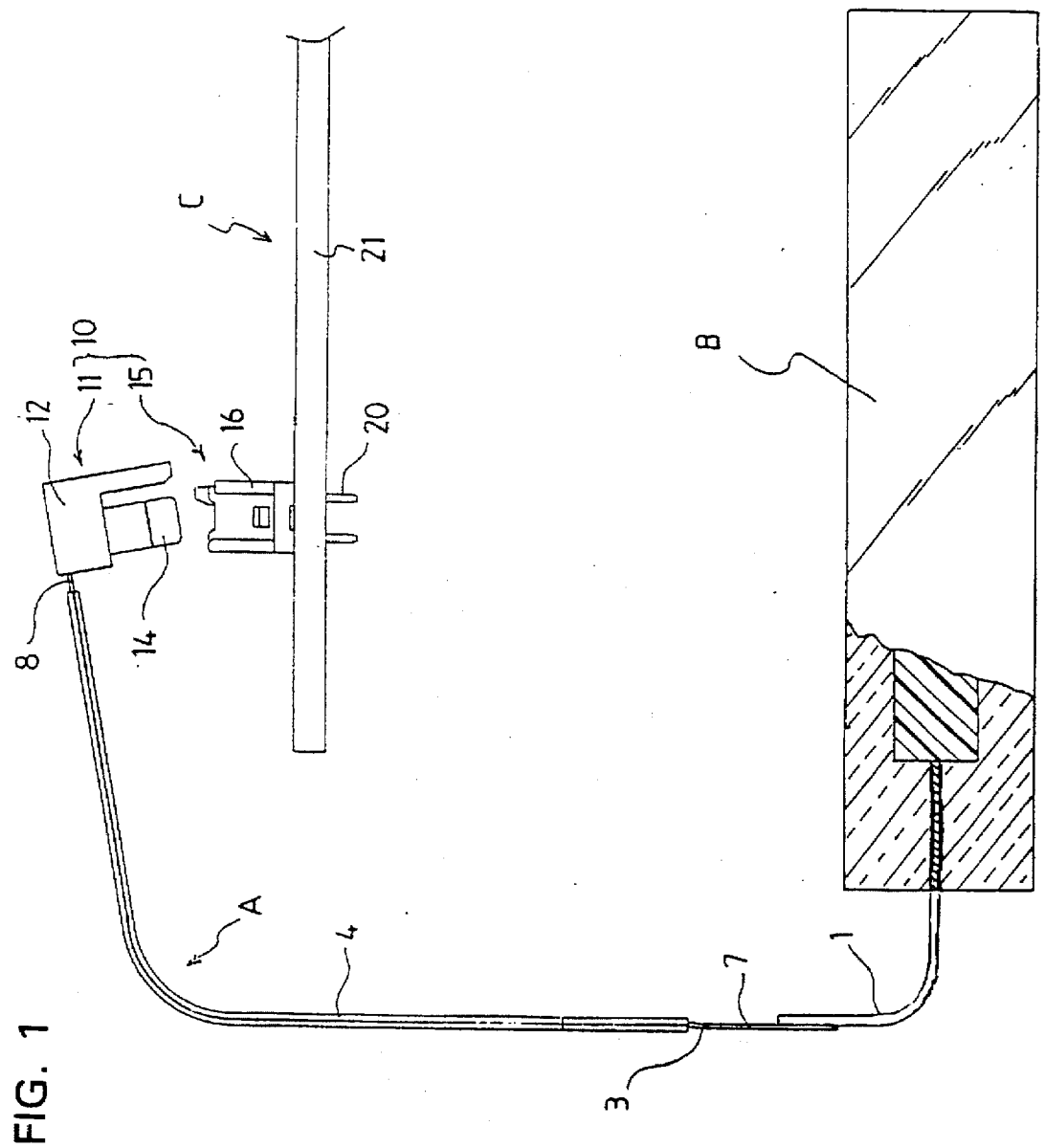
FIG. 1 shows the embodiment of the electrical connector system used to connect the metal leads protruding from the glass-sealed electrical device to another group of circuits.

Referring to FIG. 1, a stamped conductor array "A" comprises a side by side arrangement of stamped conductors 3 at regular intervals for connecting metal leads 1 protruding from a glass-sealed electrical device such as a liquid crystal display "B" to an associated electrical apparatus "C" such as a printed circuit board 21. One end 7 of each of the conductors 3 in the array are laser beam-welded to the metal leads 1 protruding from the glass sealed liquid crystal display "B". The other end 8 of the conductors 3 are connected to the printed circuits of the electric apparatus "C" by way of the mating connector arrangement 10.

Figure 2:
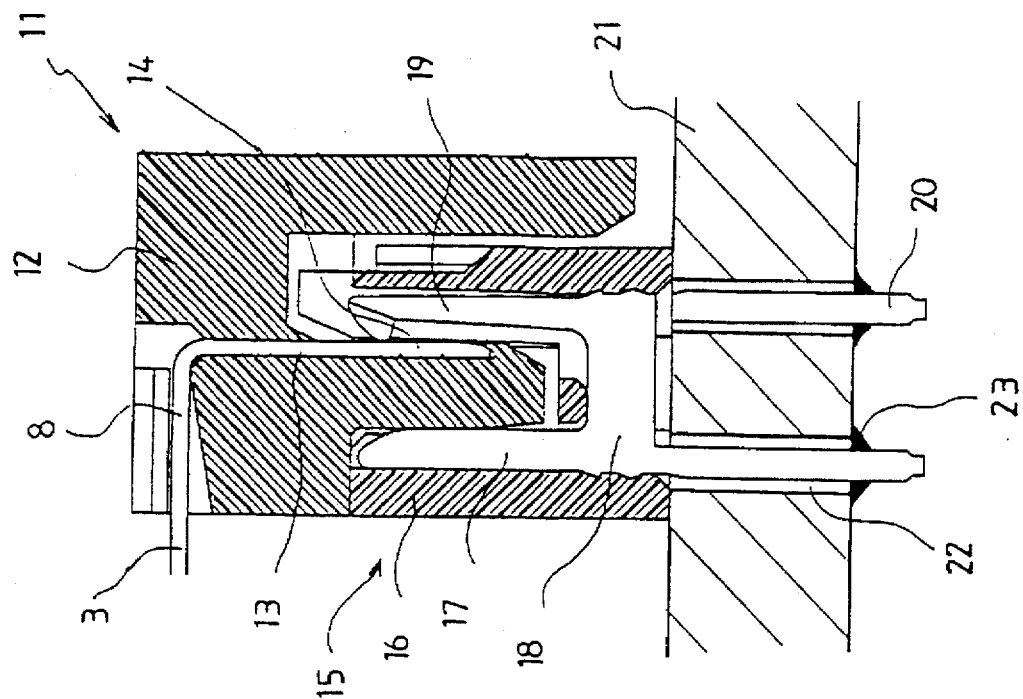
FIG. 2 is a longitudinal section of a connector which is joined to one end of the stamped conductors.
Figure 3:
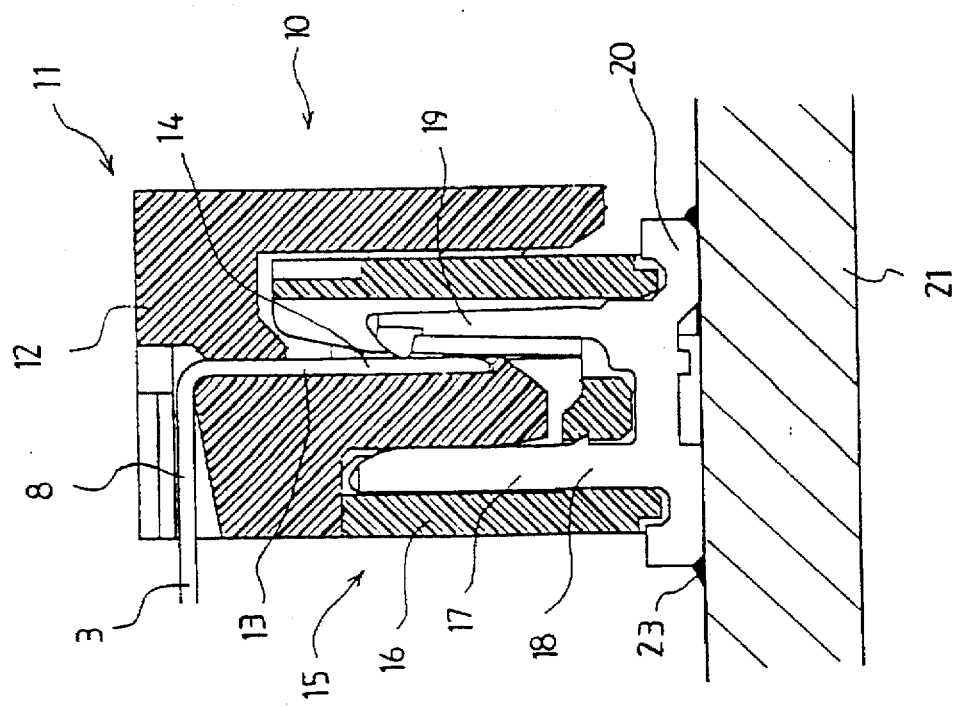
FIG. 3 is a longitudinal section of an alternate embodiment of the connector.

As shown in FIG. 1, a male plug 11 is joined to the other end 8 of each of the conductors in the array. This joining may be made by using an insert molding process or by using a latch lock arrangement between the conductors and the male plug housing 12. The male plug 11 is adapted to mate with a cooperating female connector 15, which is soldered to a printed circuit board 21. Referring to FIG. 2, the male plug 11 comprises a dielectric housing 12 having the other end 8 of each of the conductors 3 fixed in an array. The female connector 15 comprises a housing 16 having female terminals 17 held therein. The solder tails 20 of the female terminal 17 are inserted through holes 22 in the printed circuit board 21 to be soldered to the printed circuits thereon, of as indicated at 23. When the male plug 11 and female connector 15 are mated together, the contact portions 19 of the female terminal 17, make an electric connection between the display unit "B" and the printed circuit board "C". FIG. 3 shows an surface mounted type connector where the female terminals 17 are soldered to the printed circuits on the surface of the printed circuit board 21.

Figure 4:
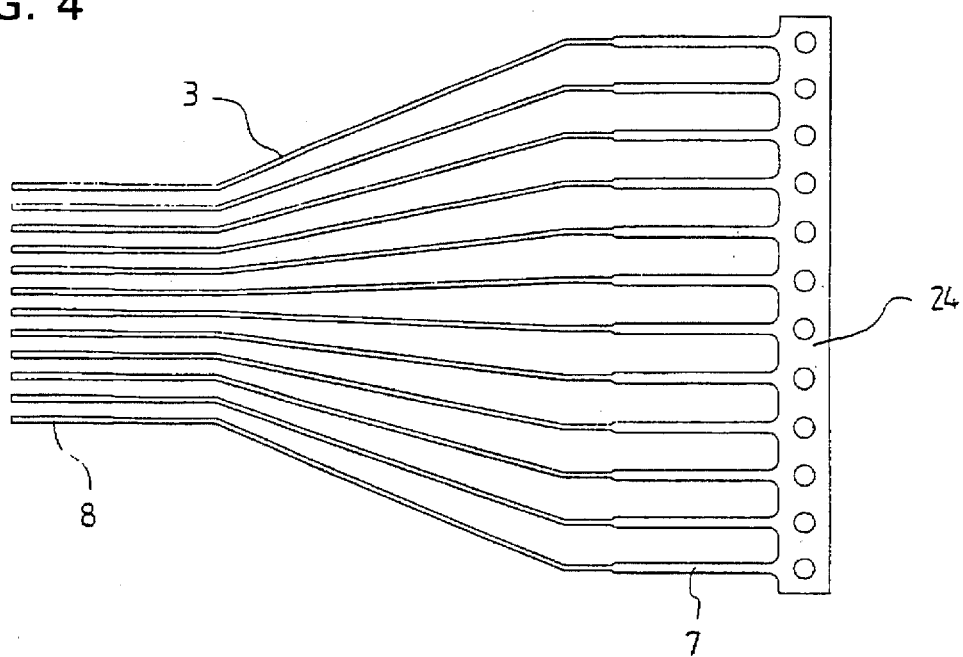
FIG. 4 is a plane view of an array of conductors stamped out of a sheet of metal.
Figure 5:
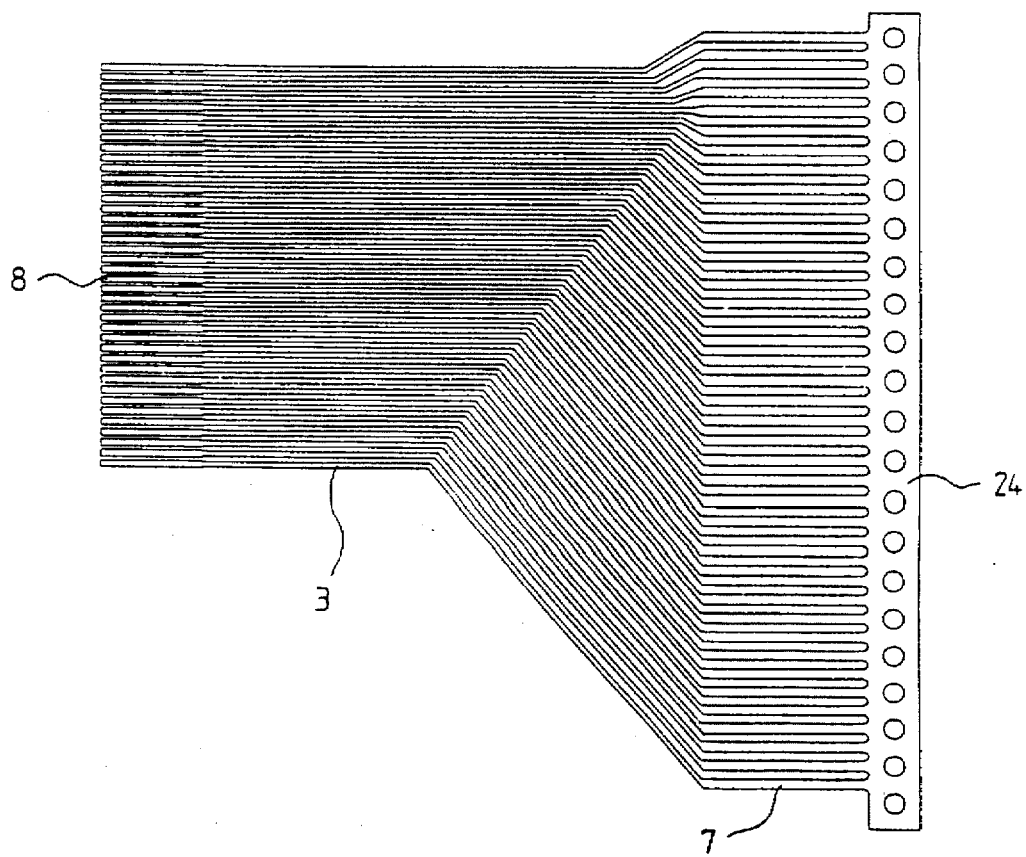
FIG. 5 is a plane view of an alternate array of conductors stamped out of a sheet of metal.
Figure 6:
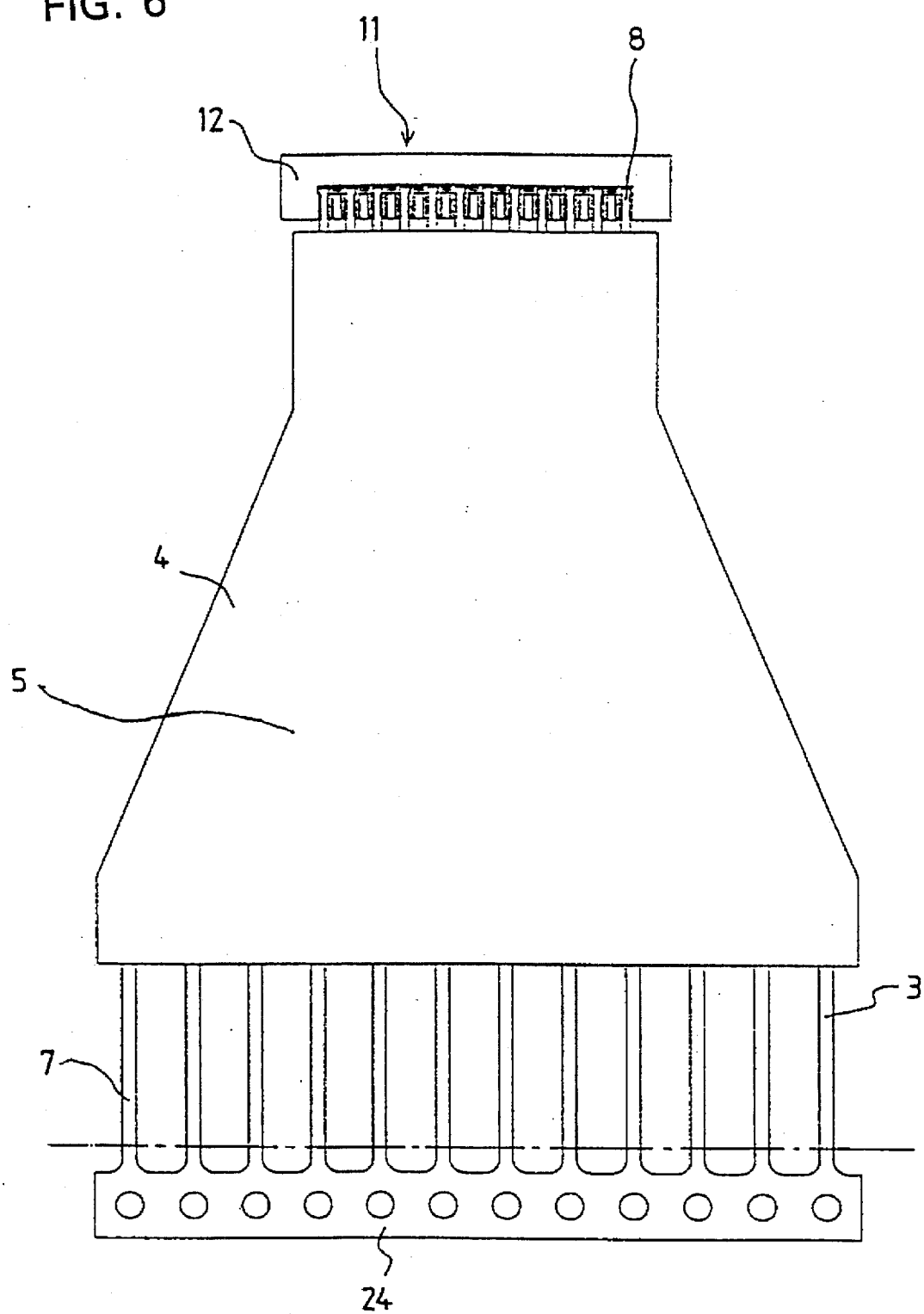
FIG. 6 is a plane view of an array of stamped conductors having pieces of insulation tape applied to opposite sides of the conductors.
Figure 7:
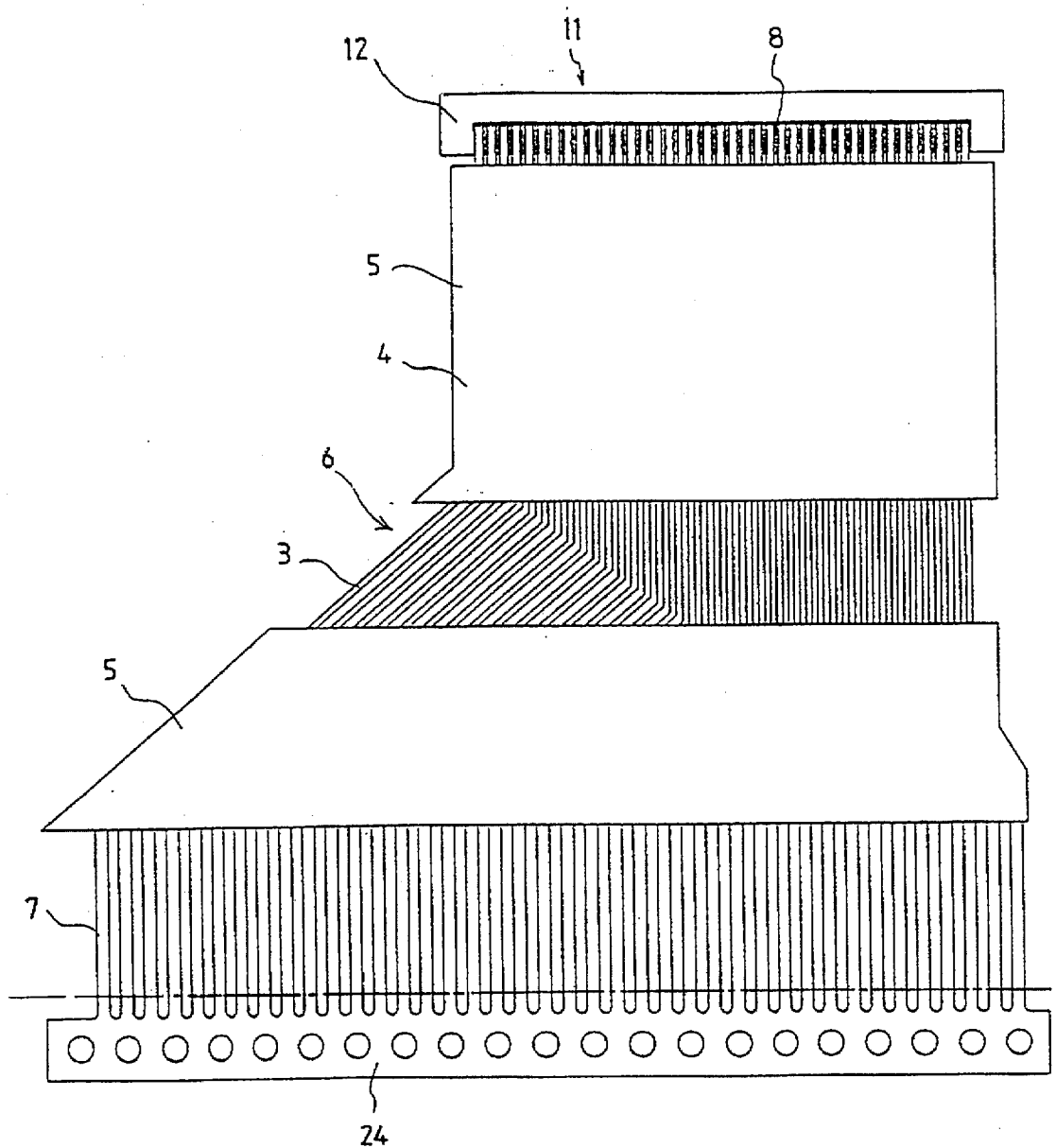
FIG. 7 is a plane view of an array of stamped conductors having pieces of insulation tape applied to opposite ends of the conductor array, partially exposing the conductors at the middle.
Figure 8:
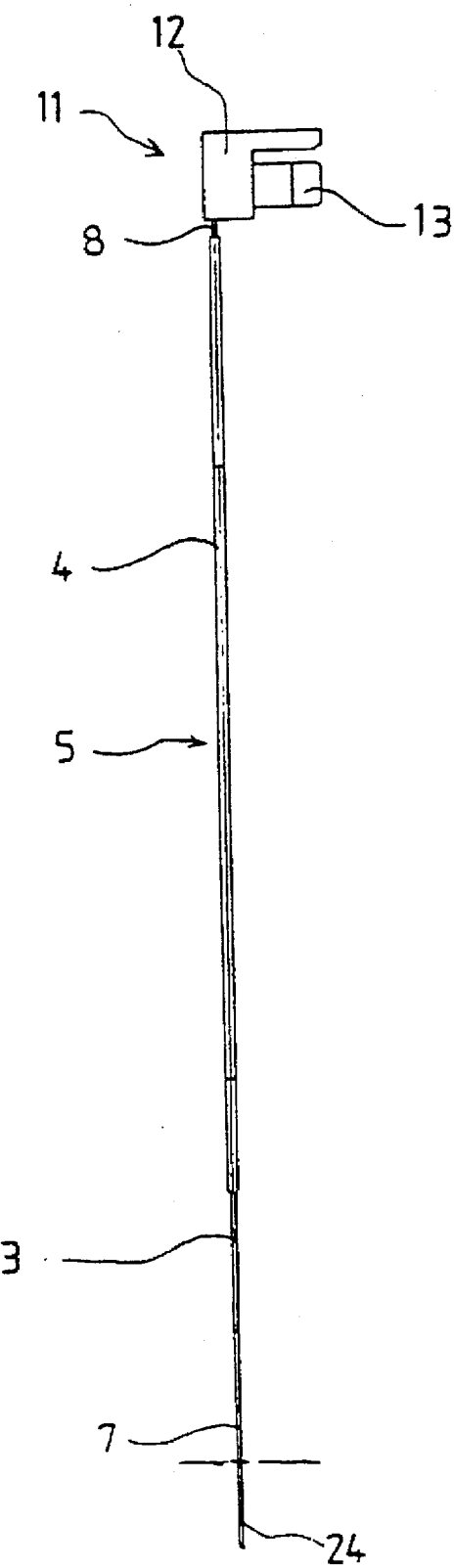
FIG. 8 is a side view of an array of stamped conductors held together with insulation tape and with a connector housing at one end.

Referring to FIGS. 4 and 5, two arrays of conductors 3 are made by stamping a sheet of metal where the melting point of the metal is generally equal to that of the metal of the protruding metal leads 1. As shown in FIGS. 6, 7 and 8, the array of stamped conductors 3 are maintained together during handling after removal of margin 24 with pieces of insulation tape 4 applied to opposite surfaces of the conductors. This will create insulation areas 5. The tape well not only hold the conductors together at regular intervals without creating short circuits but will also provide some flexibility to the array.

As shown in FIG. 7, the conductor array has two areas 5 of insulation tape 4 applied to opposite surfaces. This allows for a portion of the conductors 3 at the midpoint between the ends to be uncovered by the tape and, therefor, to be exposed to the environment providing a heat-radiating area 6. The radiation of the heat from this area 6 prevents such thermal problems as may otherwise be caused by heating. The life of any heat sensitive electric apparatus connected to a heat generating device will be extended with the use of the embodiment with the heat radiating area.

Referring to FIGS. 4 and 5, a piece of metal sheet having a melting point generally equal to that of the metal of the glass-sealed metal leads 1 is stamped to provide a conductor array comprising a plurality of conductors 3 arranged side by side at regular intervals. As seen from FIGS. 6, 7 and 8, pieces of insulation tape 4 are applied to the opposite sides of the conductors, allowing opposite ends 7 and 8 to be exposed for making necessary electric connections to the associated metal leads and the female terminals 17.

A reliable connection is assured by providing a stamped side by side array of conductors 3 at regular intervals where the melting point of the conductors is generally equal to that of the glass-sealed metal leads 1. Conductors stamped from a sheet of iron-and-nickel alloy can be more resistive to the high temperature and thermal impact or shock caused by the laser beam welding. After one end 8 of the conductors 3 is fixed to the housing, the margin 24 of the punched metal sheet is cut and removed as indicated by the dot-and-dash line in FIG. 7. The other end 7 of the conductors 3 are fused by laser beam welding.

Thanks to the stamped conductors and the protruded metal leads having substantially the same melting or welding point, these different parts will be subjected to the same degree of thermal expansion and contraction when exposed to high temperature and thermal impact caused by laser beam welding. Therefore, no defective connections will be created due to extraordinary melting of one metal as compared to the other.

Obviously, many modifications may be made without departing from the basic spirit of the present invention. Accordingly, it will be appreciated by those skilled in the art that, within the scope of the appended claims, the invention may be practiced other than has been specifically described herein.

I claim:

1. An electrical connector system for a liquid crystal display, said liquid crystal display completely sealed in a glass enclosure with metal leads protruding from said enclosure, said metal leads having a melting point greater than the melting point of the glass, comprising:

a connector assembly for electrically connecting said metal leads to a mating circuit member and including, a dielectric housing, conductors stamped from a thin flat sheet of metal having a melting point equal to the melting point of said metal leads and formed in a side by side array at regular intervals, each of said conductors having two ends and maintained in said array by a flexible sheet of dielectric material adhered to at least one surface of said conductors, one end of each conductor held in said dielectric housing and adapted to mate with terminals in said mating circuit member, and the other end of each conductor adapted to be fused with heat to a respective one of said metal leads.

2. A connector system according to claim 1 wherein said stamped conductors are made from a sheet of an iron and nickel alloy.

3. A connector system according to claim 1 wherein said stamped conductors are made of the same metal as used to make the metal leads extending from the liquid crystal display.

4. A connector system according to claim 1 wherein said flexible sheet of dielectric material is adhered to opposite surfaces of the conductors.

5. A connector system according to claim 4 wherein said dielectric material is located adjacent each end of the conductors and arranged so that the conductors are partially exposed generally at the midpoint of the conductor array.

* * * * *